United States Patent

Onitsuka et al.

[11] Patent Number: 6,049,167
[45] Date of Patent: Apr. 11, 2000

[54] ORGANIC ELECTROLUMINESCENT DISPLAY DEVICE, AND METHOD AND SYSTEM FOR MAKING THE SAME

[75] Inventors: Osamu Onitsuka, Chiba; Akira Ebisawa, Ibaraki; Mitsunari Suzuki, Chiba; Hiroshi Yamamoto; Michio Arai, both of Tokyo, all of Japan

[73] Assignee: TDK Corporation, Tokyo, Japan

[21] Appl. No.: 09/023,714

[22] Filed: Feb. 13, 1998

[30]     Foreign Application Priority Data

Feb. 17, 1997 [JP] Japan ..................................... 9-048427
Feb. 25, 1997 [JP] Japan ..................................... 9-056855

[51] Int. Cl.[7] ...................................................... H01J 1/62
[52] U.S. Cl. ................................ 313/512; 313/24; 313/25
[58] Field of Search ................................. 313/512, 498; 445/24, 25

[56]                     References Cited

U.S. PATENT DOCUMENTS 5,194,027  3/1993  Kruskopf et al. ........................ 445/25

FOREIGN PATENT DOCUMENTS

| 0 776 147 | 5/1997  | European Pat. Off. . |
| 3-261091  | 11/1991 | Japan . |
| 4-249092  | 9/1992  | Japan . |
| 5-036475  | 2/1993  | Japan . |
| 5-89959   | 4/1993  | Japan . |
| 7-011247  | 1/1995  | Japan . |
| 7-211456  | 8/1995  | Japan . |
| 8-111285  | 4/1996  | Japan . |
| 8-124677  | 5/1996  | Japan . |

OTHER PUBLICATIONS

P. E. Burrows, et al., Applied Physics Letters, vol. 65, No. 23, pp. 2922–2924, "Reliability and Degradation of Organic Light Emitting Devices", Dec. 5, 1994.
Patent Abstracts of Japan, vol. 17, No. 22 (E–1307), Jan. 14, 1993, JP 4–249092, Sep. 4, 1992.

*Primary Examiner*—Nimeshkumar D. Patel
*Assistant Examiner*—Todd Reed Hopper
*Attorney, Agent, or Firm*—Oblon, Spivak, McClelland, Maier & Neustadt, P.C.

[57]                         ABSTRACT

In an organic EL display device, an organic EL multilayer structure is disposed in a gastight space defined between a substrate and a shield member and filled with an inert gas. The organic EL multilayer structure includes organic materials having a Tg of at most 140° C. The shield member is a continuous member free of a filling port. The shield member is joined to the substrate with a UV-curing epoxy resin adhesive of the cationic curing type. The inert gas in the space has a water content of at most 100 ppm. The steps of forming layers on substrates to form organic EL multilayer structures and the steps of adhesively joining shield members to the substrates are carried out in inert gas atmospheres.

12 Claims, 6 Drawing Sheets

ORGANIC ELECTROLUMINESCENT DISPLAY DEVICE, AND METHOD AND SYSTEM FOR MAKING THE SAME

This invention relates to organic electroluminescent display devices and a method and system for manufacturing the same.

BACKGROUND OF THE INVENTION

Organic electroluminescent display device includes a matrix of organic electroluminescent (EL) or light-emitting elements wherein those elements selected so as to constitute characters or symbols are driven to emit light, thereby displaying the information. The organic EL elements have the basic structure that a hole transporting material such as tetraphenyl diamine (TPD) is evaporated or otherwise deposited as a thin film on a transparent electrode of tin-doped indium oxide (ITO) serving as a hole injecting electrode, a fluorescent material such as aluminum quinolinol complex (Alq3) is deposited thereon as a light emitting layer, and an electrode of a metal having a low work function such as magnesium is formed thereon as an electron injecting electrode. These organic EL elements are of great interest in the art because they can emit light at a very high luminance of 100 to 1,000 $cd/m^2$ with a drive voltage of about 10 volts.

The organic EL elements have the problem that they are very sensitive to moisture. For example, the presence of moisture can cause separation between the light emitting layer and the electrode layers or degradation of the constituent materials, generating dark spots or failing to maintain light emission.

One method for solving this problem is disclosed in JP-A 89959/1993 wherein a gastight casing having a filling port is closely secured to a substrate so as to cover an organic EL multilayer structure on the substrate, and the interior of the casing is then filled with an inert gas. More particularly, after the gastight casing is closely secured to the substrate, the casing interior is evacuated through the filling port to remove residual moisture from the casing interior. An inert gas is introduced into the casing interior through the filling port whereupon the filling port is blocked, thereby establishing an inert gas atmosphere with a minimal water content in the casing interior for protecting the organic EL multilayer structure. In practice, the evacuation and inert gas introduction steps are repeated several times until the water content in the casing interior is reduced to an aim level.

The method of using such a gastight casing is successful in protecting the organic EL multilayer structure from moisture to some extent, but has the following problems. In a typical prior art system for manufacturing organic EL display devices, a first section for forming layers of the organic EL multilayer structure and a second section for introducing the inert gas into the casing joined to the organic EL multilayer structure are separate so that the layer forming operation and the gas filling operation are carried out separately. When the organic EL multilayer structure is transferred from the first section to the second section, there is a likelihood that the organic EL multilayer structure be exposed to the ambient air and moisture deposit on the organic EL multilayer structure. This moisture has a potential to later exacerbate the organic EL multilayer structure.

Further, when the gastight casing is closely secured to the substrate, epoxy resin base adhesives having high moisture resistance are typically used. Two-part mix type epoxy resin adhesives consisting of a base component part and a curing agent which are mixed on use, and thermosetting epoxy resin adhesives requiring no mixing are now commercially available. The two-part mix type epoxy resin adhesives have the advantage that they are curable at room temperature, but are less practical because of slow curing requiring several hours, a need for mixing before the application of adhesive, and a short pot life. On the other hand, the thermosetting epoxy resin adhesives are usually cured at as high a temperature as 140 to 180° C. In the case of organic EL display devices which are manufactured by forming an organic EL multilayer structure on a substrate and then closely securing a gastight casing to the substrate with an adhesive, the heat resistance of organic EL multilayer structure becomes the bar against the use of thermosetting epoxy resin adhesives. It is well known that the heat resistance of an organic material as used in the organic EL multilayer structure is closely related to its glass transition temperature. There is no problem if the glass transition temperature of the organic material is higher than the curing temperature of thermosetting epoxy resin adhesives. However, most organic materials heretofore known suitable in the organic EL multilayer structure have a glass transition temperature of about 75° C. to about 100° C., and even special advanced organic materials with improved heat resistance have reached a glass transition temperature of about 130° C. Therefore, the use of ordinary thermosetting epoxy resin adhesives is undesirable because the organic EL display devices can be thermally damaged.

There is a demand for adhesives which quickly cure without a need for heat. Photo-curing adhesives might satisfy these requirements. However, most photo-curing adhesives are acrylic adhesives of the radical curing type, which are inferior in moisture resistance to the epoxy resin adhesives. Additionally, acrylic monomers serving as an active ingredient of these adhesives can penetrate into or chemically react with the organic materials of the organic EL multilayer structure, degrading the structure to a sufficient extent to cause a failure or separation. Such degradation will result in non-light-emitting spots known as dark spots and shorten the luminous life. There are also available photo-curing/thermosetting combined type epoxy resin adhesives. Since these adhesives are obtained by the mixing or modification of acrylic adhesives of the radical curing type with thermosetting epoxy resin adhesives, they have not solved the above-mentioned problems.

The prior art inert gas introducing apparatus has the problems that every time when devices are manufactured, the steps of vacuum evacuation and inert gas introduction must be repeated several times for each device, and the filling port must be blocked, which lead to an increased number of steps and an increased manufacturing time.

SUMMARY OF THE INVENTION

An object of the present invention is to provide an organic EL display device having a long life.

Another object of the present invention is to provide a method and system for manufacturing an organic EL display device through a smaller number of steps and in a simple manner.

The present invention is directed to an organic electroluminescent (EL) display device comprising a substrate, a shield member defining a gastight space with the substrate, and an organic electroluminescent multilayer structure disposed in the space, the space being filled substantially solely with an inert gas.

According to the invention, the organic electroluminescent multilayer structure includes organic materials having a glass transition temperature of up to 140° C. The shield member is a continuous member free of a filling port. The shield member is joined to the substrate with a UV-curing epoxy resin adhesive of the cationic curing type. The inert gas in the space has a water content of up to 100 ppm.

In one preferred embodiment, the shield member is a plate member and joined to the substrate with a UV-curing epoxy resin adhesive of the cationic curing type having fine particles dispersed therein which also forms a spacer for defining the space with the substrate and the shield member.

In a second aspect, a method for preparing an organic electroluminescent display device as defined above is provided. The method involves the steps of establishing as a working zone an atmosphere of the inert gas to be contained in the space having a water content of up to 100 ppm; and joining the shield member to the substrate with an adhesive in the inert gas atmosphere, thereby confining the inert gas within the space defined between the substrate and the shield member, thereby eliminating a need for the shield member to have a filling port for introducing the inert gas. The adhesive is preferably a UV-curing epoxy resin adhesive of the cationic curing type.

The method may further include the step of curing the adhesive in the inert gas atmosphere until the curing is completed.

The method may further include the steps of heating the components of the organic electroluminescent display device in vacuum to remove residual water therefrom; carrying the components into the inert gas atmosphere while maintaining them dry; and leaving the components to stand in the inert gas atmosphere until the residual water contents in the components reach equilibrium with the water content in the inert gas atmosphere, followed by the joining step.

The method may further include the steps of successively forming layers on the substrate in distinct vacuum chambers by individual film forming processes appropriate for the respective layers while maintaining the vacuum atmosphere, thereby forming the organic electroluminescent multilayer structure; carrying the organic electroluminescent multilayer structure to the subsequent step without exposing it to the air, through a vacuum or an atmosphere of the inert gas to be contained in the space having a water content of up to 100 ppm; receiving the organic electroluminescent multilayer structure without exposing it to the air and assembling the shield member to the substrate bearing the organic electroluminescent multilayer structure. The working zone in which the assembling step is performed is an atmosphere of the inert gas to be contained in the space, whereby the shield member is joined to the substrate with an adhesive in the inert gas atmosphere, thereby confining the inert gas within the space defined between the substrate and the shield member, thereby eliminating a need for the shield member to have a filling port for introducing the inert gas.

In another embodiment, the carrying step uses a carrier box whose interior is vacuum or filled with the inert gas to be contained in the space and in which the organic electroluminescent multilayer structure is accommodated.

In one preferred embodiment, the layer forming step, the carrying step, and the assembling step are performed in working chambers which are connected in a gastight manner.

In a third aspect, the present invention provides a system for preparing an organic electroluminescent display device as defined above, the system comprising a layer forming section in which layers are successively formed on the substrate in distinct vacuum chambers by individual film forming processes appropriate for the respective layers, thereby forming the organic electroluminescent multilayer structure, and an assembling section connected to the layer forming section in a gastight manner in which the shield member is assembled to the substrate bearing the organic electroluminescent multilayer structure, wherein the assembling section includes a fore-chamber connecting the layer forming section to the assembling section in a gastight manner and a main working chamber in which an adhesive is applied to the shield member and/or the substrate bearing the organic electroluminescent multilayer structure, and the shield member and the substrate are joined together, at least the main working chamber is connected to a vacuum means and an inert gas source so as to establish an inert gas atmosphere having a water content of up to 100 ppm in the main working chamber where the joining operation is performed.

The assembling section may further include an aft-chamber connected to the main working chamber in a gastight manner in which the adhesive is cured.

The layer forming section may include a vacuum vessel and a holding/carrying means disposed in the vacuum vessel, and the distinct vacuum chambers are disposed around the vacuum vessel.

BRIEF DESCRIPTION OF THE DRAWINGS

These and other objects, features, and advantages of the invention will become more fully understood by reading the following description taken in conjunction with the accompany drawings.

DESCRIPTION OF THE PREFERRED EMBODIMENTS

Device

Figure 1:
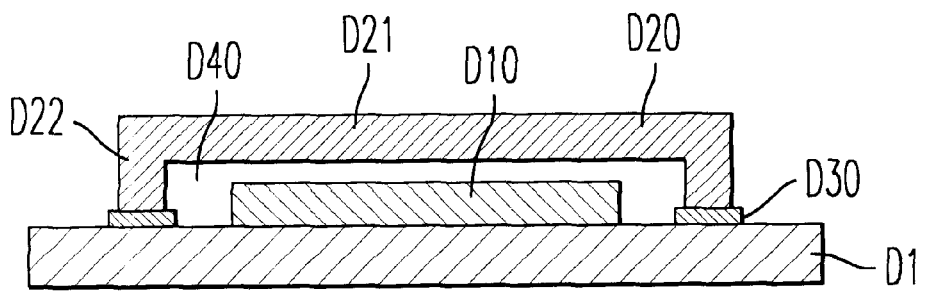
FIG. 1 is a cross-sectional view of an organic EL display device according to one embodiment of the invention.

Referring to FIG. 1, there is illustrated an organic EL display device according to one embodiment of the invention. The organic EL display device is illustrated in FIG. 1 as comprising a substrate D1, an organic EL multilayer structure D10 on the substrate D1, and a box-shaped shield member D20 disposed on the substrate D1 and enclosing the organic EL multilayer structure D10.

The shield member D20 is preferably formed of glass, metals, ceramics, or low moisture permeable polymers. The shield member D20 is a continuous member which is one piece as a whole and does not have a filling port or other opening. In the illustrated example, the box-shaped shield member D20 consists of a rectangular top member D21 and a side wall D22 extending perpendicularly from the entire periphery of the top member D21. Since the organic EL multilayer structure D10 usually has an overall height of about 300 nm to about 500 nm, the side wall D22 is preferably set to a height of about 1 μm to about 500 μm. The lower end of the side wall D22 is closely secured to the substrate D1 with an adhesive D30 to define a gastight space D40 between the substrate D1 and the shield member D20. The adhesive used herein is a UV-curing epoxy resin adhesive of the cationic curing type. Since layer-forming materials of the organic EL multilayer structure usually have a glass transition temperature of at most about 140° C., typically from about 80° C. to about 100° C., the use of conventional thermosetting adhesives having a curing temperature of about 140° C. to about 180° C. gives rise to the problem that upon curing of the adhesive, the organic EL multilayer structure can soften and deteriorate its characteristics. In contrast, UV-curing adhesives do not give rise to the problem that the organic EL multilayer structure can soften. However, the currently available UV-curing adhesives yet have the problem that since they are acrylic base adhesives, acrylic monomers can volatilize upon curing of the adhesive, which adversely affects the layer-forming materials of the organic EL multilayer structure to deteriorate its characteristics. Searching for the adhesive which eliminates or minimizes this problem, we have found that a UV-curing epoxy resin adhesive of the cationic curing type is best suited.

It is noted that UV-curing/thermosetting combined type epoxy resin adhesives are encompassed in commercially available UV-curing epoxy resin adhesives. Since most of these adhesives are obtained by the mixing or modification of acrylic resins of the radical curing type with thermosetting epoxy resins, they have not solved the acrylic monomer volatilization problem of acrylic resins and the curing temperature problem of thermosetting epoxy resins. Then, the UV-curing/thermosetting combined type epoxy resin adhesives are not desirable as the adhesive for use in the manufacture of organic EL display devices of the invention.

The UV-curing epoxy resin adhesive of the cationic curing type, as used herein, is an adhesive composition comprising an epoxy resin as a base component and a Lewis acid salt type curing agent as a main curing agent which upon exposure to light containing UV radiation, releases a Lewis acid catalyst through photolysis whereby the epoxy resin polymerizes and cures through a reaction mechanism of cationic polymerization type. The epoxy resins used as the base component of the adhesive include epoxidized olefinic resins, alicyclic epoxy resins, and novolak epoxy resins. Examples of the curing agent include Lewis acid salts of aromatic diazonium, Lewis acid salts of diallyl iodonium, Lewis acid salts of triallyl sulfonium, and Lewis acid salts of triallyl selenium.

The gastight space D40 is filled with an inert gas such as helium, argon and nitrogen. The inert gas contained in the space D40 should desirably have a water content of up to 100 ppm, more desirably up to 10 ppm, most desirably up to 1 ppm. The water content has no particular lower limit although the lower limit is usually about 0.1 ppm.

Figure 2:
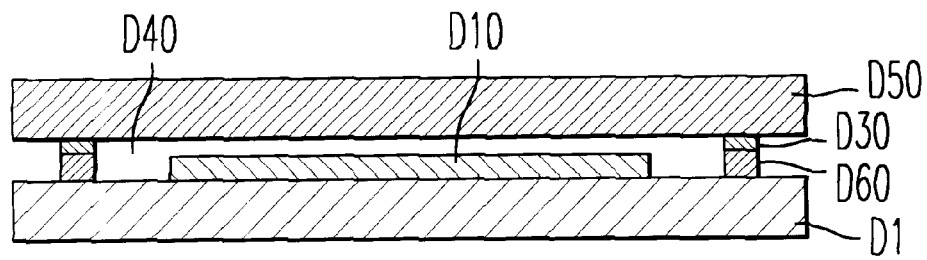
FIG. 2 is a cross-sectional view of an organic EL display device according to another embodiment of the invention.

Although the shield member of box shape is illustrated in the above embodiment, the shield member may be a tabular member D50 as shown in FIG. 2. In the embodiment of FIG. 2 wherein the plate-shaped shield member D50 is used, using a suitable adhesive dispenser, the adhesive is previously applied to the substrate D1 to form a desired pattern of adhesive. The adhesive is cured to form a spacer D60 which should have a height which is slightly greater than the height of the organic EL multilayer structure D10. The plate-shaped shield member D50 is then placed on the spacer D60 and secured thereto with an adhesive D30, to thereby define the gastight space D40. In this embodiment, the space D40 is defined by the substrate D1, the shield member D50, and the adhesive spacer D60, D30. Since the organic EL multilayer structure D10 usually has an overall height of about 300 nm to about 500 nm, the spacer D60 is preferably set to a height of about 1 μm to about 500 μm. The gastight space D40 is also filled with an inert gas having a low water content as in the first embodiment.

In one preferred embodiment, fine particles having a certain rigidity are dispersed in the adhesive D30 whereby the layer formed by the adhesive D30 itself also serves for the function of a spacer. That is, the layer formed by the adhesive D30 itself also serves as the spacer D60. The fine particles used herein preferably have a diameter of about 1 to 500 μm, especially about 5 to 100 μm. They are preferably formed of polymers such as divinylbenzene, benzoguanamine or styrene or inorganic materials such as silica, glass fibers or glass beads.

Preferably the adhesive is loaded with about 0.1 to 30%, especially 1 to 10% by weight of fine particles based on the total weight of the adhesive and particles. The adhesive loaded with less than 0.1% of fine particles would not achieve the full function as a spacer because the number of fine particles dispersed per unit area is too small. Loading of more than 30% of fine particles is undesirable because fine particles tend to agglomerate so that the layer of the loaded adhesive may occupy a thickness greater than the diameter of discrete fine particles, application of the loaded adhesive through a dispenser would become difficult due to the increased viscosity, and sufficient bond strength would not be achieved.

In either of the structural embodiments of the organic EL display device, the adhesive for joining the shield member to the substrate should preferably be spaced apart from the organic EL multilayer structure. If the adhesive is in contact with the organic EL multilayer structure, the adhesive might penetrate between layers of the organic EL multilayer structure, causing separation and hence, deterioration.

Figure 3:
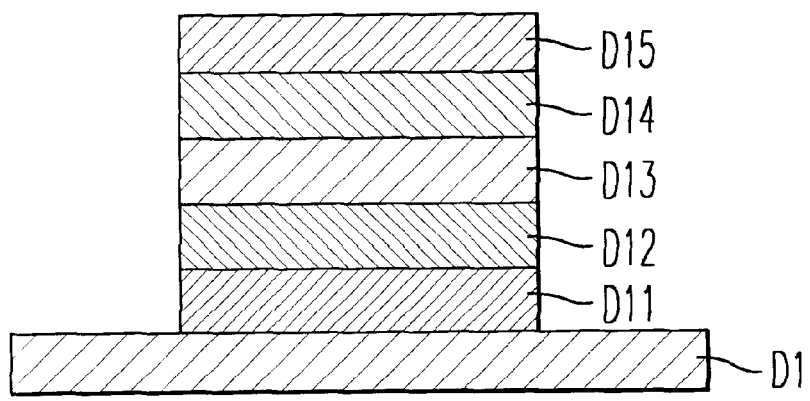
FIG. 3 is a cross-sectional view showing the layer arrangement of one exemplary organic EL multilayer structure in the organic EL display device of the invention.

Referring to FIG. 3, one exemplary layer arrangement of the organic EL multilayer structure D10 in FIGS. 1 and 2 is described.

The organic EL multilayer structure D10 includes a hole injecting electrode D11, a hole injecting and transporting layer D12, a light emitting layer D13, an electron injecting and transporting layer D14, and an electron injecting electrode D15 stacked on the substrate D1 in the described order.

The layer arrangement of the organic EL multilayer structure which can be used herein is not limited to the illustrated one. Various other layer arrangements are possible. For example, the light emitting layer and the electron injecting and transporting layer may be mixed into a single layer. Alternatively, the light emitting layer may be mixed with the hole injecting and transporting layer if necessary.

In the construction wherein light emission emanates on the substrate side, the substrate is formed of a transparent or translucent material such as glass, quartz or resins. The substrate may be provided with a color filter film, fluorescent material-containing color conversion film or dielectric reflecting film for controlling the color of light emission.

A transparent electrode is used as the hole injecting electrode. The material and thickness of the hole injecting electrode are preferably determined so that at least 80% of the emitted light may be transmitted by the electrode. For example, tin-doped indium oxide (ITO), zinc-doped indium oxide (IZO), $SnO_2$ and doped polypyrrole are useful for the hole injecting electrode. The thickness of the hole injecting electrode is typically about 10 to about 500 nm.

For effective electron injection, the electron injecting electrode is preferably formed of materials having a low work function, for example, metal elements such as K, Li, Na, Mg, La, Ce, Ca, Sr, Ba, Al, Ag, In, Sn, Zn, and Zr and binary and ternary alloys containing two or three of them for improving stability. Preferred alloys are Ag—Mg (Ag: 1 to 20 at %), In—Mg (Mg: 50 to 80 at %), and Al—Ca (Ca: 5 to 20 at %). In forming the electron injecting electrode, any of these metals and alloys is used as the target.

The electron injection electrode is usually formed as a thin film having a sufficient thickness to ensure electron injection, typically at least 50 nm, preferably at least 100 nm. The upper limit is not critical although the film thickness is usually about 100 to 500 nm.

Next, the organic material layers included in the organic EL multilayer structure according to the invention are described.

The light emitting layer has the functions of injecting holes and electrons, transporting them, and recombining holes and electrons to create excitons. It is preferred that relatively electronically neutral compounds be used in the light emitting layer.

The hole transporting layer, which is also referred to as a hole injecting and transporting layer, has the functions of facilitating injection of holes from the hole injecting electrode, transporting holes, and obstructing electron transportation.

The electron injecting and transporting layer has the functions of facilitating injection of electrons from the electron injecting electrode, transporting electrons, and obstructing hole transportation. It is desirable that this electron injecting and transporting layer is provided when the compound used in the light emitting layer has a relatively low electron injecting and transporting function.

The hole and electron injecting and transporting layers are effective for increasing the number of holes and electrons injected into the light emitting layer and confining holes and electrons therein for optimizing the recombination region to improve light emission efficiency. Each of the hole and electron injecting and transporting layers may be constructed by separately providing a layer having an injecting function and a layer having a transporting function.

The thickness of the light emitting layer, the hole injecting and transporting layer, and the electron injecting and transporting layer is not critical and varies with a particular formation technique although it is usually preferred to range from about 5 nm to about 100 nm, especially about 10 nm to about 100 nm.

The thickness of the hole injecting and transporting layer and the electron injecting and transporting layer is equal to or ranges from about 1/10 times to about 10 times the thickness of the light emitting layer although it depends on the design of a recombination/light emitting region. When the electron or hole injecting and transporting layer is divided into an injecting layer and a transporting layer, preferably the injecting layer is at least 1 nm thick and the transporting layer is at least 1 nm, especially at least 20 nm thick. The upper limit of thickness is usually about 500 nm, especially about 100 nm for the injecting layer and about 500 nm, especially about 100 nm for the transporting layer. The same film thickness applies when two injecting/transporting layers are provided.

By controlling the layer thickness while taking into account the carrier mobility and carrier density (dependent on ionization potential and electron affinity) of the light emitting layer, the hole injecting and transporting layer, and the electron injecting and transporting layer to be combined, the free design of a recombination/light emitting region, the design of emission color, the control of the luminance and spectrum of light emission by the interference of both the electrodes, and the control of the spatial distribution of light emission become possible.

The light emitting layer contains a fluorescent material that is a compound having a light emitting capability. The fluorescent material may be selected from metal complex dyes such as tris(8-quinolinolato)aluminum as disclosed in JP-A 264692/1988, for example. Additionally, quinacridone, coumarin, rubrene, and styryl dyes, tetraphenylbutadiene, anthracene, perylene, coronene, and 12-phthaloperinone derivatives may be used alone or in admixture with the metal complex dye. In the embodiment wherein the light emitting layer also serves as an electron injecting and transporting layer, the use of tris(8-quinolinolato)aluminum is preferred. These fluorescent materials can be evaporated or otherwise deposited.

For the electron injecting and transporting layer, there may be used organic metal complexes such as tris(8-quinolinolato)aluminum (Alq3), oxadiazole derivatives, perylene derivatives, pyridine derivatives, pyrimidine derivatives, quinoline derivatives, quinoxaline derivatives, diphenylquinone derivatives, and nitro-substituted fluorene derivatives. The electron injecting and transporting layer can also serve as a light emitting layer as previously mentioned. In this case, use of tris(8-quinolinolato)aluminum etc. is preferred. Like the light emitting layer, the electron injecting and transporting layer may be formed by evaporation or the like.

Where the electron injecting and transporting layer is formed as comprising an electron injecting layer and an electron transporting layer, two or more compounds are selected in a proper combination from the compounds commonly used in electron injecting and transporting layers. In this regard, it is preferred to laminate layers in such an order that a layer of a compound having a greater electron affinity may be disposed adjacent the electron injecting electrode. This order of lamination also applies where a plurality of electron injecting and transporting layers are provided.

For the hole injecting and transporting layer, there may be used various organic compounds as described in JP-A 295695/1988, 191694/1990, 000792/1991, 234681/1993, 239455/1993, 299174/1993, 126225/1995, 126226/1995, and 100172/1996 and EP 0650955A1. Examples are tetraarylene-benzidine compounds (triaryldiamine or triphenyldiamine (TPD)), aromatic tertiary amines, hydrazone derivatives, carbazole derivatives, triazole derivatives, imidazole derivatives, oxadiazole derivatives having an amino group, and polythiophenes. These compounds may be used in a combination of two or more and for the combined use, they may be stacked as separate layers or mixed.

Where the hole injecting and transporting layer is formed as comprising a hole injecting layer and a hole transporting layer, two or more compounds are selected in a proper combination from the compounds commonly used in hole injecting and transporting layers. In this regard, it is preferred to laminate layers in such an order that a layer of a compound having a lower ionization potential may be disposed adjacent the hole injecting electrode (ITO etc.). It is also preferred to use a compound having good thin film forming ability at the anode surface. The order of lamination also applies where a plurality of hole injecting and transporting layers are provided. Such an order of lamination is effective for lowering drive voltage and preventing the occurrence of current leakage and the appearance and growth of dark spots. Since evaporation is utilized in the manufacture of devices, films as thin as about 1 to 10 nm can be formed uniform and pinhole-free, which restrains any change in color tone of light emission and a drop of efficiency by re-absorption even if a compound having a low ionization potential and absorption in the visible range is used in the hole injecting layer. Like the light emitting layer and the like, the hole injecting and transporting layer can be formed by evaporating the above-mentioned compounds.

The organic EL multilayer structure of the invention may be prepared in a conventional way. For example, the light emitting layer and other organic material layers may be formed by vacuum evaporation, and the hole injecting electrode and the electron injecting electrode may be formed by evaporation or sputtering. If necessary, these layers can be patterned, for example, by mask evaporation or film formation followed by etching whereby a desired light emitting pattern is accomplished. If the substrate bears thin film transistors (TFT), the respective layers may be formed in accordance with the pattern of TFT to accomplish a display or drive pattern without further treatment. Finally, a protective layer may be formed over the structure using inorganic materials such as SiOx and organic materials such as Teflon®.

The organic EL element of the invention is generally of the DC drive type while it can be of the AC or pulse drive type. The drive voltage should preferably be low in order to improve the reliability of the device. The applied voltage is generally about 5 to 20 volts.

Method

Next, the method for manufacturing the organic EL display device is described. The method is characterized by the step of attaching the shield member D20 to the substrate D1 having the organic EL multilayer structure D10 borne thereon, that is, sealingly enclosing the organic EL multilayer structure D10 in the shield member D20, which is first described below.

Figure 4:
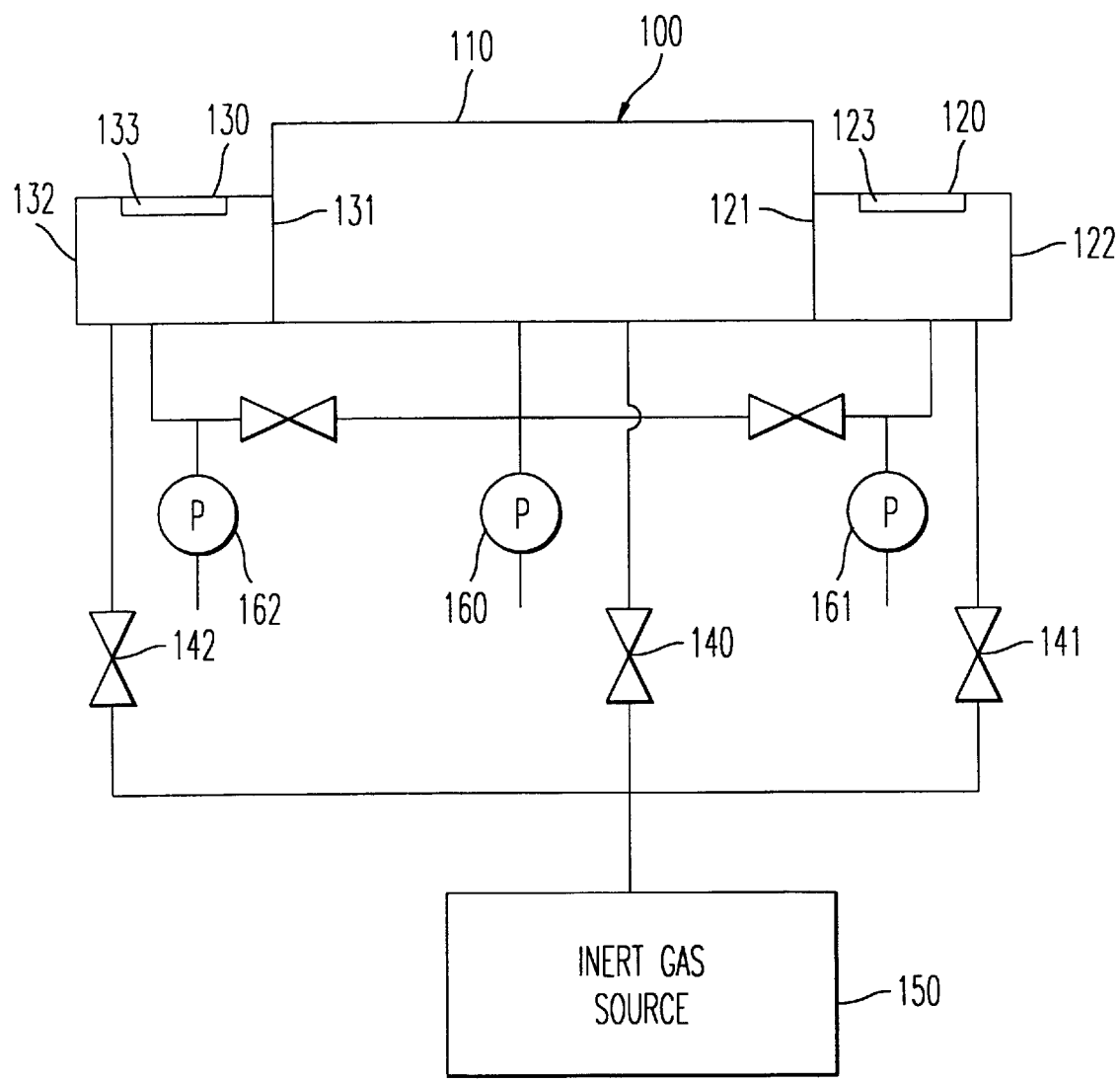
FIG. 4 illustrates a gastight working chamber for use in the manufacture of the organic EL display device of the invention.

Before the start of the enclosing step, a gastight working chamber 100 is furnished as shown in FIG. 4. The gastight working chamber 100 includes a main working chamber 110 and optionally, a gastight fore-chamber 120 and a gastight aft-chamber 130.

Selectively openable and closable gastight shutters 121 and 131 are disposed between the main working chamber 110 and fore- and aft-chambers 120 and 130 for maintaining the main working chamber 110 gastight. A third gastight shutter 122 is disposed at the inlet of the fore-chamber 120 which is otherwise open to the ambient air and through which the components of the organic EL display device are carried in. The third gastight shutter 122 cooperates with the first gastight shutter 121 to maintain the fore-chamber 120 gastight. A fourth gastight shutter 132 is disposed at the outlet of the aft-chamber 130 which is otherwise open to the ambient air and through which the completed organic EL display device are carried out. The fourth gastight shutter 132 cooperates with the second gastight shutter 131 to maintain the aft-chamber 130 gastight.

The main working chamber 110, fore-chamber 120 and aft-chamber 130 are connected to an inert gas source 150 through first, second and third valves 140, 141 and 142. The inert gas source 150 reserves the same inert gas as contained in the space D40 of the organic EL display device (FIGS. 1 and 2) and is capable of feeding the inert gas to the main working chamber 110, fore-chamber 120 and aft-chamber 130.

The main working chamber 110, fore-chamber 120 and aft-chamber 130 are also connected to first, second and third vacuum pumps 160, 161 and 162, respectively, for evacuating the respective chambers. It is acceptable to connect the first vacuum pump 160 connected to the main working chamber 110 to the second and third vacuum pumps 161 and 162 so that all the chambers may initially be evacuated by means of the first vacuum pump 160. To this end, the first vacuum pump 160 should preferably have a greater capacity.

The fore-chamber 120 is preferably provided with a heater 123 for heating the fore-chamber 120 for causing any residual water in the components of the organic EL display device (that is, the organic EL multilayer structure D10 on the substrate D1 and the shield member D20) to evaporate off. Typically, the interior of the fore-chamber 120 is heated at about 60 to 70° C. for about 1 to 5 hours under a vacuum of about 1 to $10^{-1}$ Pa. The heater 123 is preferably an electric heater. While a thermometer in the form of a CA (chromel-alumel) thermocouple (not shown) is provided within the fore-chamber 120 for measuring the temperature thereof, the temperature within the fore-chamber 120 is program controlled within the range from room temperature to about 200° C. by the proportional integral and derivative (PID) control process. To achieve satisfactory temperature control in a vacuum atmosphere, an electric heater having a power of 1 kW or more is preferably used.

It is noted that the gastight fore-chamber 120 is preferably disposed contiguous to a film forming section where layers are deposited to form the organic EL multilayer structure (as will be illustrated later in FIG. 5).

On the other hand, the gastight aft-chamber 130 is provided with an adhesive curing means 133 for causing the adhesive to cure for joining the substrate D1 having the organic EL multilayer structure D10 borne thereon to the shield member D20. The adhesive curing means 133 is a UV radiation emitting device, which emits UV radiation at an illuminance of 50 to 1,000 mW/cm² so that the adhesive may be fully cured within an appropriate irradiation time, for example, of about 5 to 100 seconds.

It is now described how to manufacture the organic EL display device using the gastight working chamber 100. Since the procedures for forming the layers or films of the organic EL multilayer structure D10 on the substrate D1 may be the same as in the prior art, the description about these procedures is omitted herein. The following description is based on the assumption that the organic EL multilayer structure D10 has already been formed on the substrate D1.

First, the main working chamber 110 and the aft-chamber 130 of the gastight working chamber 100 are evacuated or degassed and instead, the inert gas is introduced into these chambers. The evacuation and inert gas injection are repeated several times until an inert gas atmosphere having a purity of 90 to 99.9%, especially 99.0 to 99.9% and a water content of up to 100 ppm, preferably up to 10 ppm, especially up to 1 ppm is established in the chambers. The lower the water content, the better become the results. In the state of the art, the minimum ultimate water content is about 0.1 ppm. After the aim water content is reached for the inert gas atmosphere, an inert gas having a lower water content than that inert gas atmosphere is circulated through the chambers to maintain the water content at or below the once reached level.

Next, the third shutter 122 is opened, and a plurality of organic EL multilayer structures D10 and shield members D20 or D50 are carried into the fore-chamber 120, whereupon the third shutter 122 is closed again. At this point, the fore-chamber 120 is evacuated, preferably to a vacuum of about 1 to $10^{-1}$ Pa.

In the fore-chamber 120, with the vacuum of about 1 to $10^{-1}$ Pa kept, the heater 123 is energized to heat the organic EL multilayer structures D10 and the shield members D20 or D50 for removing residual water therefrom.

After the residual water is removed, the first shutter 121 is opened, and the organic EL multilayer structures and the shield members are carried into the main working chamber 110 where the adhesive is applied to joint portions of the substrates of the organic EL multilayer structures and/or the shield members. Then, the shield members are joined to the substrates of the organic EL multilayer structures at their joint portions into assemblies. It is preferred that the organic EL multilayer structures and the shield members, prior to the application of the adhesive, are left to stand for a certain time in the main working chamber, that is, the inert gas atmosphere until the residual water contents in the structures and the shield members reach equilibrium with the water content in the inert gas atmosphere, and thereafter, the adhesive is applied to the joint portions.

Thereafter, the second shutter 131 is opened, and the finished assemblies are carried to the aft-chamber 130 where the adhesive curing means 133 is energized to irradiate UV radiation to the adhesive for curing, thereby completing the organic EL display devices shown in FIG. 1 or 2.

Finally, the fourth shutter 132 is opened whereupon the completed organic EL display devices are taken out.

In this way, organic EL display devices having the gastight space D40 filled with the inert gas can be manufactured without a need for a filling port.

System

Next, one preferred embodiment of the system for manufacturing the organic EL display devices according to the invention is described.

Figure 5:
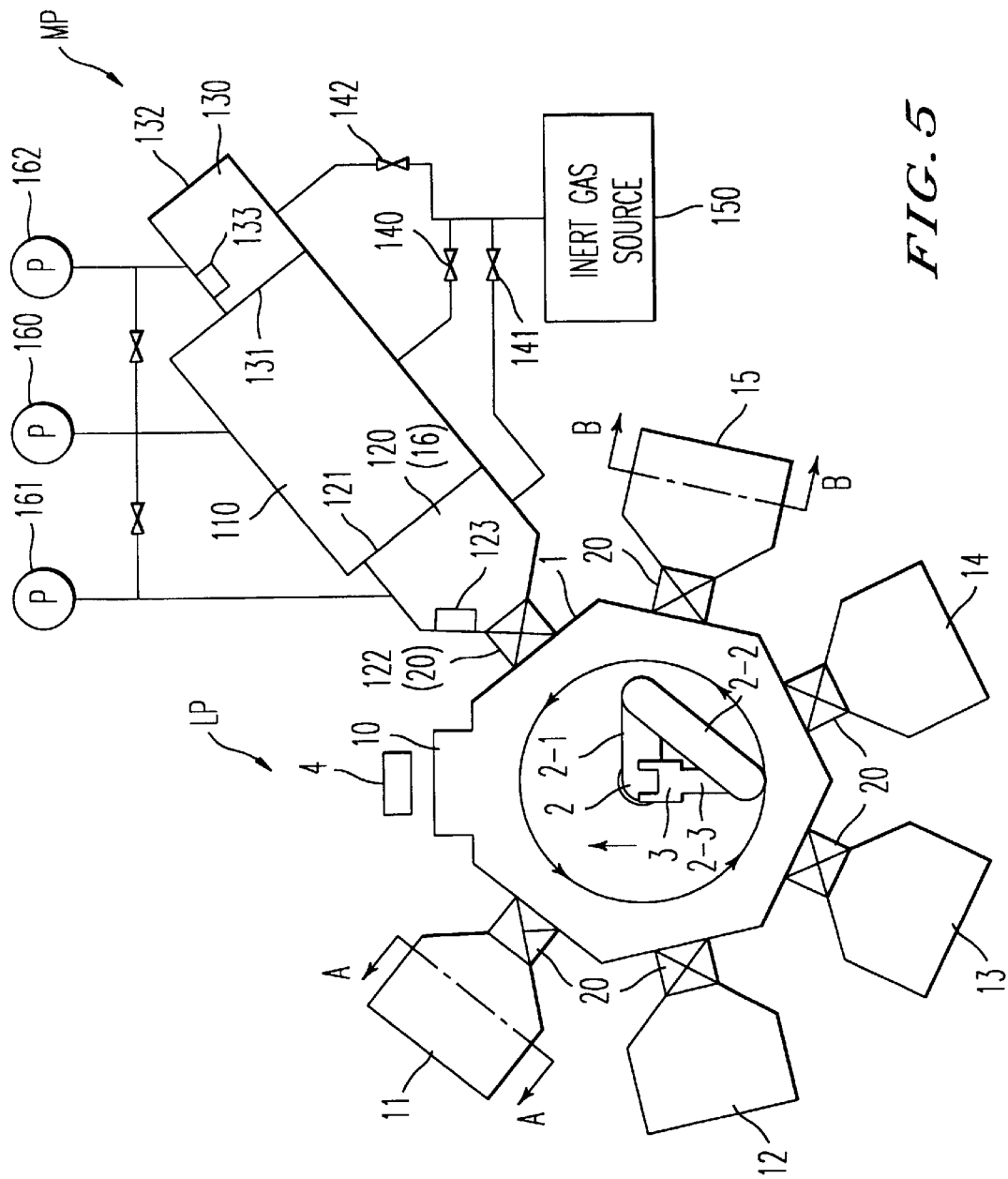
FIG. 5 illustrates a system for manufacturing the organic EL display device according to the invention.

Referring to FIG. 5, the system includes a film forming section LP where layers of organic EL multilayer structures are formed and an assembly section MP where shield members are joined to the organic EL multilayer structures. The film forming section LP and the assembly section MP are connected in a gastight manner. The assembly section MP is the same as illustrated in FIG. 4.

The film forming section LP includes a hollow cylinder shaped vacuum vessel 1, a robot 2, a holder 3, an organic EL wafer 4, a substrate entrance 10, working vacuum chambers 11 to 15, an organic EL multilayer structure transition portion 16, and gate valves 20.

The robot 2 is installed within the vacuum vessel 1. The working vacuum chambers 11 to 15 are disposed around the periphery of the vacuum vessel 1 in a cluster fashion and communicated thereto through the gate valves 20. The vacuum vessel 1 is provided with the sealingly closable substrate entrance 10 which receives the organic EL wafer 4 having a transparent electrode D11 formed on a glass substrate D1. The wafer 4 is caught by the robot 2, pulled into the vacuum vessel 1 through the substrate entrance 10, and successively moved into and out of the working vacuum chambers 11 to 15 in this order or in any desired order whereby a hole injecting and transporting layer D12, a light emitting layer D13, an electron injecting and transporting layer D14, an electron injecting electrode D15, and an aluminum protective or sealing layer (not shown) are successively formed on the wafer 4 to produce the organic EL multilayer structure.

The robot 2 is constructed such that the organic EL wafer 4 may be successively moved into and out of the working vacuum chambers 11 to 15. To this end, the robot 2 has three arms 2-1, 2-2 and 2-3, for example. These arms 2-1, 2-2 and 2-3 are interlocked such that the holder 3 formed at the tip of the third arm 2-3 may be movable and rotatable in all 360° directions in vertical and horizontal planes.

The holder 3 holds a holding plate 5 having the organic EL wafer 4 rested thereon. The holder 3 is bifurcated into fingers 3-1 and 3-2 adapted to be inserted into counter slots 6-1 and 6-2 in a receiving platform 6 to be described later in FIG. 8.

Figure 6:
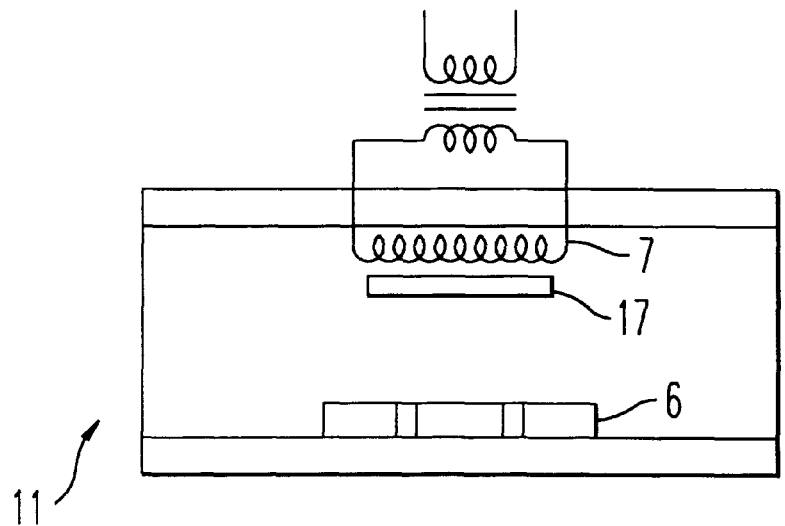
FIG. 6 is a cross-sectional view taken along lines A—A in FIG. 5, showing the working vacuum chamber serving as an evaporation chamber.

The first working vacuum chamber 11 is, for example, a chamber in which the step of forming the hole injecting and transporting layer D12 is performed by evaporation. FIG. 6 is a cross section of the first chamber 11 taken along lines A—A in FIG. 5. As shown in the cross-sectional view of FIG. 6, the first working vacuum chamber 11 includes the receiving platform 6, a heater 7, and an evaporation source 17.

Figure 8:
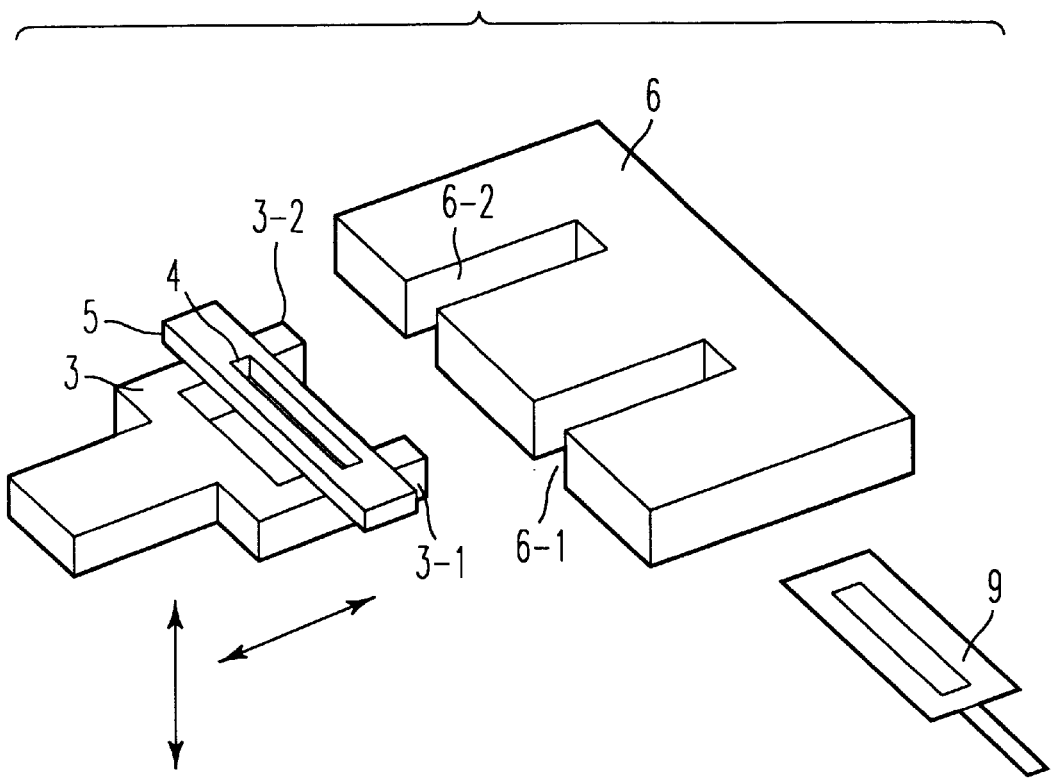
FIG. 8 is a perspective view showing a receiving platform in the working vacuum chamber relative to a robot arm.

The receiving platform 6 adapted to receive the holding plate 5 having the organic wafer 4 rested thereon is formed with the slots 6-1 and 6-2 as shown in FIG. 8. In the state shown in FIG. 8, the robot 2 is operated to move the holder 3 to the right whereby the fingers 3-1 and 3-2 are inserted into the slots 6-1 and 6-2 of the receiving platform 6. During this movement, the upper surface of the fingers 3-1 and 3-2 is held slightly higher than the upper surface of the receiving platform 6, and hence, the holding plate 5 is moved to above the receiving platform. Just when the holding plate 5 reaches the predetermined position, the holder 3 is moved down whereupon the holding plate 5 is left on the receiving platform 6 at the predetermined position.

In this state, the gate valve 20 is closed and electricity is conducted through the heater 7 to heat the evaporation source 17 whereby the source material is evaporated onto the organic EL wafer 4. After the completion of evaporation, the gate valve 20 is opened again and the robot 2 is operated so as to move the holder 3 to insert the fingers 3-1 and 3-2 into the slots 6-1 and 6-2 while the upper surface of the fingers 3-1 and 3-2 is held lower than the upper surface of the receiving platform 6. Just when the holder 3 reaches the predetermined position, it is slightly moved up whereby the evaporated organic EL wafer 4 is rested on the holder 3 again. The robot 2 is operated so that the wafer 4 is moved out of the first working vacuum chamber 11. Thereafter, the wafer 4 is similarly moved into the second working vacuum chamber 12 and placed on the receiving platform 6 in the second chamber 12. In this way, film formation is successively performed on the wafer in a series of working vacuum chambers. It is noted that when a mask 9 is furnished as shown in FIG. 8, mask evaporation is possible by positioning the mask 9 above the organic EL wafer 4.

For example, the second working vacuum chamber 12 is to evaporate the light emitting layer D13, the third working vacuum chamber 13 is to evaporate the electron injecting and transporting layer D14, and the fourth working vacuum chamber 14 is to evaporate the electron injecting electrode D15. These chambers are of the same construction as the first working vacuum chamber 11 shown in FIG. 6.

Figure 7:
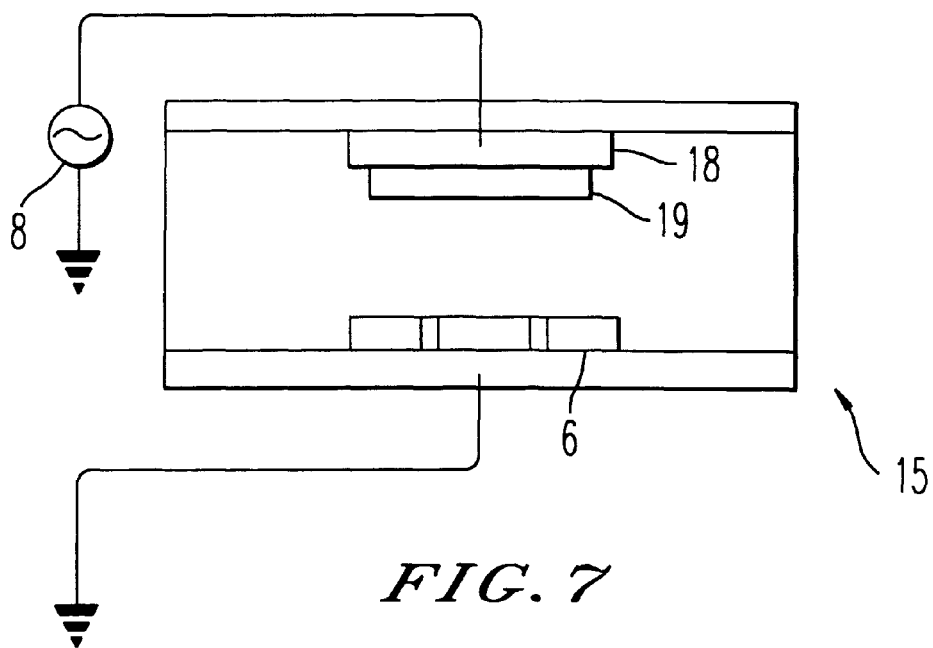
FIG. 7 is a cross-sectional view taken along lines B—B in FIG. 5, showing the working vacuum chamber serving as a sputtering chamber.

The fifth working vacuum chamber 15 is, for example, a chamber in which the step of forming an aluminum layer is performed by sputtering. FIG. 7 is a cross section of the fifth chamber 15 taken along lines B—B in FIG. 5. As shown in the cross-sectional view of FIG. 7, the sputtering vacuum chamber 15 also includes a receiving platform 6 as in the evaporating vacuum chambers, an electrode 18 disposed above the receiving platform 6, and a target 19 disposed close to and below the electrode 18. An RF source 8 applies an RF voltage across the electrode 18 to generate in the chamber an RF discharge by which the target 19 is sputtered, while argon gas is introduced into the chamber. The aluminum layer is formed on the organic EL wafer 4 rested on the receiving platform 6.

The working vacuum chambers 11 to 14 and the working vacuum chamber 15 are disposed around the vacuum vessel 1 in a cluster arrangement.

The operation of the film forming section LP is described below. First, the organic EL wafer 4 having the transparent electrode D11 formed on the glass substrate D1 is rested on the holding plate 5, which is moved into the vacuum vessel 1 through the window of the substrate entrance 10 and rested on the holder 3 of the robot 2. The gate valves 20 associated with the respective working vacuum chambers 11 to 15 are opened and the vacuum vessel 1 is evacuated by means of a vacuum pump (not shown).

When the vacuum vessel 1 is evacuated to the predetermined pressure, the holder 3 of the robot 2 is moved into the first chamber 11, the holding plate 5 having the organic EL wafer 4 rested thereon is placed on the receiving platform 6 as mentioned above, and the gate valve 20 is then closed. The heater 7 is energized to heat the evaporation source 17 to evaporate the hole injecting and transporting material, thereby forming the hole injecting and transporting layer D12.

After the hole injecting and transporting layer D12 is formed in this way, the gate valve 20 associated with the first chamber 11 is opened, and the robot 2 is operated such that the holding plate 5 on which the organic EL wafer 4 having the hole injecting and transporting layer D12 formed thereon rests is held by the holder 3 of the robot, moved out of the first chamber 11, moved into the second chamber 12, and placed on the receiving platform 6 in the second chamber. The gate valve 20 associated with the second chamber 12 is closed. The heater 7 is energized to heat the evaporation source 17 to evaporate the light emitting material, thereby forming the light emitting layer D13.

After the light emitting layer D13 is formed, the gate valve 20 associated with the second chamber 12 is opened, and the robot 2 is operated such that the holding plate 5 on which the organic EL wafer 4 having the light emitting layer D13 formed thereon rests is held by the holder 3 of the robot, moved out of the second chamber 12, moved into the third chamber 13, and placed on the receiving platform 6 in the third chamber. The gate valve 20 associated with the third chamber 13 is closed. The heater 7 is energized to heat the evaporation source 17 to evaporate the electron injecting and transporting material, thereby forming the electron injecting and transporting layer D14.

After the electron injecting and transporting layer D14 is formed in this way, the gate valve 20 associated with the third chamber 13 is opened, and the robot 2 is operated such that the holding plate 5 on which the organic EL wafer 4 having the electron injecting and transporting layer D14 formed thereon rests is held by the holder 3 of the robot, moved out of the third chamber 11, moved into the fourth chamber 14, and placed on the receiving platform 6 in the fourth chamber. The gate valve 20 associated with the fourth chamber 14 is closed. The heater 7 is energized to heat the evaporation source 17 to evaporate the electron injecting material, thereby forming the electron injecting electrode D15.

After the electron injecting electrode D15 is formed, the gate valve 20 associated with the fourth chamber 14 is opened, and the robot 2 is operated such that the holding plate 5 on which the organic EL wafer 4 having the electron injecting electrode D15 formed thereon rests is held by the holder 3 of the robot, moved out of the fourth chamber 14, moved into the fifth chamber 15, and placed on the receiving platform 6 in the fifth chamber. The gate valve 20 associated with the fifth chamber 15 is closed. An RF voltage is applied across the electrode 18 from the RF source 8 to generate an RF discharge, thereby sputtering the target 19 to form an aluminum layer on the organic EL wafer 4.

After the aluminum layer is formed in this way, the gate valve 20 associated with the fifth chamber 15 is opened, and the robot 2 is operated such that the holding plate 5 on which the organic EL multilayer structure rests is carried to the transition portion 16 which is kept vacuum.

Figure 9:
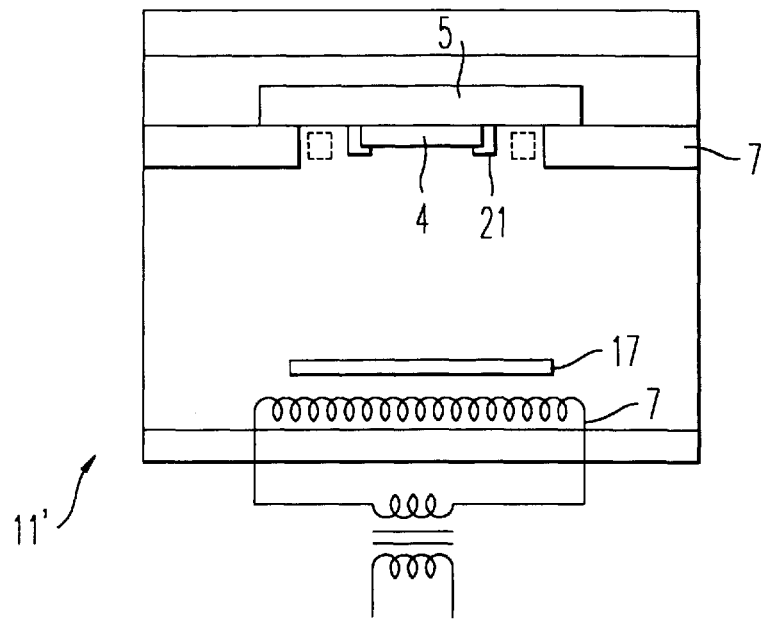
FIG. 9 is a cross-sectional view similar to FIG. 6, showing another exemplary working vacuum chamber serving as an evaporation chamber.

Although the receiving platform 6 is positioned on the bottom of the working vacuum chamber in the illustrated embodiment, the position of the receiving platform 6 is not limited thereto. Another working vacuum chamber 11' for evaporation is shown in FIG. 9 wherein the receiving platform 6 is positioned near the top of the chamber and the heater 7 and the evaporation source 17 are positioned rear the bottom of the chamber. In this embodiment, a plurality of claws 21 are provided for holding the wafer 4 at its edge. Blocks 22 shown by broken lines designate the areas into which the fingers 3-1 and 3-2 of the holder 3 are inserted.

Figure 10:
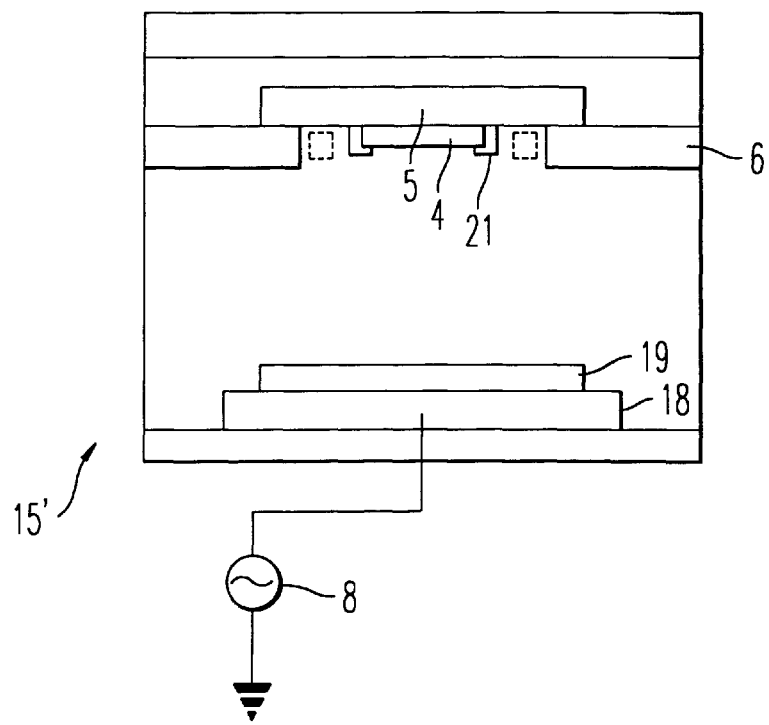
FIG. 10 is a cross-sectional view similar to FIG. 7, showing another exemplary working vacuum chamber serving as a sputtering chamber.

Similarly in a working vacuum chamber 15' for sputtering as shown in FIG. 10, the electrode 18 and the target 19 may be positioned near the bottom and the receiving platform 6 positioned near the top of the chamber.

In these modified embodiments, as a matter of course, the organic EL wafer 4 is faced toward the evaporation source 17 or target 19. The receiving platform 6 is provided with an opening so that when the holding plate 5 is rested on the platform 6, the organic EL wafer 4 is positioned in the opening.

Although the arrangement of the working vacuum chambers is counterclockwise in accordance with the order of steps in the embodiment illustrated in FIG. 5, the arrangement of the working vacuum chambers is not limited to the order of steps and may be arbitrary insofar as the robot 2 can be operated to drive its holder 3 and hence, the organic EL wafer in accordance with the order of steps. Of course, the order of steps may also be clockwise as viewed in FIG. 5.

The number of working vacuum chambers is not limited to the embodiment illustrated in FIG. 5. The number of chambers may be increased or decreased as the number of steps is increased or decreased in accordance with an appropriate number of layers.

Although the cluster type arrangement of the vacuum vessel surrounded by a series of working vacuum chambers is described in the above embodiment, an in-line arrangement wherein working vacuum chambers are arranged in a straight line may also be used.

The assembling section MP is of substantially the same construction as the gastight working chamber shown in FIG. 4. As shown in FIG. 5, the main working chamber 110 is tightly connected to the organic EL multilayer structure transition portion 16 and optionally, to the gastight aft-chamber 130. Since the transition portion 16 of the assembling section MP corresponds to the gastight fore-chamber 120 in FIG. 4, this is referred to as the fore-chamber 120, hereinafter. The fore-chamber 120 on an opposite side to the main working chamber 110 is provided with an inlet for carrying components of organic EL display devices into the fore-chamber 120 where a third gastight shutter 122 (or gate valve 20) is provided. The fore-chamber 120 is contiguous to the film forming section LP for the manufacture of organic EL multilayer structures.

The remaining components of the assembling section MP are the same as in FIG. 4. Like parts are designated by the same numerals and their description is omitted.

The method for manufacturing organic EL display devices using the above-mentioned system is now described. The manufacturing method is substantially the same as the method described in conjunction with FIG. 4. Only the description of different points is supplemented and the description of common steps is omitted.

The gastight aft-chamber 130 is provided with an adhesive curing means 133 for curing the adhesive for joining shield members D20 to substrates D1 having organic EL multilayer structures D10 borne thereon. The adhesive curing means 133 may be either a heater when the adhesive used is of the thermosetting type or a UV source when the adhesive used is of the UV curing type. As previously mentioned, if the organic EL multilayer structures are heated above the glass transition temperatures (about 80 to 100° C.) of the respective organic materials, the structures are deteriorated due to the softening of the organic materials. It is thus preferred to use UV curing type adhesives and hence, to use a UV source as the adhesive curing means 133. To fully cure the adhesive within an appropriate irradiating time, for example, of several seconds to several ten minutes, a UV source capable of providing an illuminance of 50 to 1,000 mW/cm$^2$ is used.

The main working chamber 110 and aft-chamber 130 of the gastight working chamber 100 are evacuated and filled with an inert gas so that an inert gas atmosphere having a water content of at most 100 ppm may be established in the main working chamber 110 and aft-chamber 130. To establish an inert gas atmosphere having a water content of at most 100 ppm in the main working chamber 110 and aft-chamber 130, an inert gas circulating loop may be provided which passes the main working chamber 110 and aft-chamber 130 and includes a means for drying the inert gas. Then the moisture in the respective chambers can be gradually removed while circulating the inert gas through the loop. The respective chambers are given an inert gas atmosphere meeting the above requirement.

In the system of FIG. 5, it is desired that shield members are previously delivered to the predetermined position within the vacuum vessel 1 by means of the robot 2 approximately at the same time as are the organic EL wafers.

Alternatively, an additional chamber receiving shield members is connected to the fore-chamber 120 or main working chamber 110 in a gastight manner so that shield members may be delivered from the additional chamber to the fore-chamber 120 or main chamber 110 by means of a robot.

After the fore-chamber 120 is filled with the same inert gas as in the main chamber 110, the first shutter 121 is opened, and organic EL multilayer structures and shield members are carried into the main working chamber 110 where the adhesive is applied to joint portions of substrates of the organic EL multilayer structures and the shield members. The shield members are joined to the substrates of the organic EL multilayer structures to form assemblies.

Thereafter, the second shutter 131 is opened, and the assemblies are carried into the gastight aft-chamber 130 where the adhesive curing means 133 is energized to cure the adhesive, completing organic EL display devices of the structure shown in FIG. 1 or 2.

Finally, the fourth shutter 132 is opened and the completed organic EL display devices are taken out.

In this way, organic EL display devices in which the gastight space D40 is filled with the inert gas can be manufactured without a need for a filling port.

Although the multilayer structure layer forming section and the shield member assembling section are tightly coupled in the system illustrated in FIG. 5, they need not necessarily be coupled in a gastight manner. When these sections are separate, it is desired to employ a carrier box combined with a conveyor. The carrier box is formed of a metal material such as aluminum or stainless steel or a polymeric material having low moisture permeability and low moisture absorption, that is, formed as a gastight box. The interior atmosphere of the carrier box is vacuum or an inert gas having a water content of at most 100 ppm. The inert gas is typically nitrogen or argon gas. The interior atmosphere is preferably coincident with the atmosphere of the shield member assembling section. The carrier box in which organic EL multilayer structures are accommodated is moved from the layer forming section to the assembling section. This movement may be done by a chain conveyor or a carriage. The transfer of organic EL multilayer structures from the film forming section to the carrier box and from the carrier box to the assembling section is also performed in a vacuum chamber or an inert gas atmosphere so that the organic EL multilayer structures may never be exposed to the ambient air. The use of the carrier box serving as a gastight box is encompassed in the system in which the multilayer structure layer forming section and the shield member assembling section are coupled in a gastight manner.

EXAMPLE

Examples of the present invention are given below by way of illustration.

Example 1

On a glass substrate of 1.1 mm thick, a transparent electrode was formed to a thickness of 200 nm by sputtering ITO in a predetermined pattern. The substrate was subjected to ultrasonic washing with neutral detergent, acetone, and ethanol, pulled up from boiling ethanol, and dried. After the surface of the transparent electrode was cleaned with UV/ozone, the substrate was secured by a holder in a vacuum evaporation chamber, which was evacuated to a vacuum of $1\times10^{-4}$ Pa or lower.

With the vacuum kept, 4,4',4"-tris(3-methylphenyl-phenylamino)phenylamine (MTDATA) was evaporated at a deposition rate of 0.2 nm/sec. to a thickness of 40 nm, forming a hole injecting layer. With the vacuum kept, N,N,N',N'-tetrakis(3-biphenyl)-4,4'-diamino-1,1'-biphenyl (TPD) was evaporated at a deposition rate of 0.2 nm/sec. to a thickness of 35 nm, forming a hole transporting layer.

With the vacuum kept, tris(8-quinolinolato)aluminum (Alq3) was evaporated at a deposition rate of 0.2 nm/sec. to a thickness of 50 nm, forming an electron injecting and transporting/light emitting layer.

The substrate having these layers formed thereon was then carried from the vacuum evaporation chamber to a sputtering chamber where using an Ag—Mg alloy (Mg 5 at %) as the target, an electron injecting electrode was formed by a DC sputtering technique at a deposition rate of 15 nm/min. to a thickness of 200 nm. Argon was used as the sputtering gas under a pressure of 0.5 Pa. The input power was 500 watts and the grid voltage was 6 volts. The thus obtained electron injecting electrode thin film was observed for surface smoothness under a scanning electron microscope, finding a value of 10 nm±20%.

Finally, aluminum was sputtered to a thickness of 200 nm as a protective and wiring layer, obtaining an organic EL multilayer structure.

The gastight working chamber 100 shown in FIG. 4 was conditioned as follows. The main working chamber 110 and aft-chamber 130 of the gastight working chamber 100 were evacuated and then filled with argon gas as the inert gas. The evacuation and inert gas injection steps were repeated three times. The chambers were finally filled with the inert gas having a purity of 99.9% and a water content of 10 ppm.

Next, the third shutter 122 was opened, and a plurality of organic EL multilayer structures D10 and shield members D20 were carried into the fore-chamber 120. The third shutter was then closed. In this state, the fore-chamber 120 was evacuated until a vacuum of $1 \times 10^{-1}$ Pa was established in the chamber. The shield members were glass plates of 26 mm×17 mm×1.1 mm (thick) whose one surface had been recessed to a depth of 0.5 mm to define a recess for receiving the organic EL multilayer structure therein.

Thereafter, the first shutter 121 was opened, the organic EL multilayer structures D10 and shield members D20 were carried into the main working chamber 110. An adhesive was applied to joint portions of the substrates of the organic EL multilayer structures and/or the shield members. The adhesive used herein was a UV-curing epoxy resin adhesive of the cationic curing type 30Y184G (Three Bond K.K.). Then the substrates of the organic EL multilayer structures and the shield members were joined at their joint portions to form assemblies.

Thereafter, the second shutter 131 was opened, and the assemblies were carried into the aft-chamber 130 where the curing means 133 was energized to irradiate UV radiation to the adhesive for curing. The UV illuminance was 100 mW/cm² and the irradiating time was 60 seconds. In this way, organic EL display devices of the structure shown in FIG. 1 were completed.

Finally, the fourth shutter 132 was opened, and the completed organic EL display devices were taken out.

Example 2

Organic EL display devices were fabricated as in Example 1 except that in the gastight fore-chamber 120, the heater 123 was energized from the start of evacuation, whereby a plurality of organic EL multilayer structures D10 and shield members D20 were heated in vacuum (at 60° C. for 3 hours) for removing residual water.

Example 3

Organic EL display devices were fabricated as in Example 1 except that the adhesive was cured in air.

Comparative Example 1

An organic EL display device of the structure shown in FIG. 1 was fabricated. A shield member was of the same size as in Example 1, but formed with a filling port. In air, the shield member was adhesively joined to the substrate of organic EL multilayer structure (which were the same as in Example 1), and the adhesive was cured to form an assembly. The gastight space defined in the assembly was evacuated and filled with an inert gas (which was the same as in Example 1) through the filling port. The evacuation and inert gas filling steps were repeated three times. The filling port was blocked with the adhesive. The adhesive used was the same as in Example 1.

Comparative Example 2

An organic EL display device was fabricated as in Example 1 except that a UV curing acrylic resin adhesive of the radical curing type TB-3050 (Three Bond K.K.) was used instead of the adhesive used in Example 1.

The organic EL display devices fabricated in Examples 1 to 3 and Comparative Examples 1 to 2 were examined as follows. With a DC voltage applied, the devices were continuously driven in air at a constant current density of 10 mA/cm². They all emitted green light having an emission maximum wavelength λmax of 520 nm. The initial luminance and the quarter-life of luminance (the life of a device when its luminance lowers to a quarter of the initial luminance) were measured. The devices were also observed for dark spots. With respect to the formation of dark spots, the devices were rated "Excellent" when dark spots having a diameter of more than 100 μm did not generate after 3,000 hours of operation, "Good" when dark spots having a diameter of more than 100 μm did not generate after 2,000 hours of operation, "Fair" when dark spots having a diameter of more than 100 μm did not generate after 1,000 hours of operation, and "Poor" when dark spots having a diameter of more than 100 μm generated after 100 hours of operation.

The results are shown in Table 1.

TABLE 1

|  | Applied voltage | Initial luminance | Quarter-life of luminance | Dark spots |
| --- | --- | --- | --- | --- |
| E1 | 8.1 V | 500 cd/m² | >3000 hr. | Excel |
| E2 | 8.0 V | 490 cd/m² | >3000 hr. | Excel |
| E3 | 7.9 V | 480 cd/m² | >3000 hr. | Good |
| CE1 | 7.9 V | 490 cd/m² | 500 hr.* | Poor |
| CE2 | 8.1 V | 490 cd/m² | 500 hr.* | Poor |

*difficult to measure luminance due to the growth of dark spots

Example 4

The manufacturing system shown in FIG. 5 was used.

The gastight working chamber MP (or 100 in FIG. 4) was conditioned as follows. The main working chamber 110 and aft-chamber 130 of the gastight working chamber 100 were evacuated and then filled with argon gas as the inert gas. The evacuation and inert gas injection steps were repeated three times. The chambers were finally filled with the inert gas having a purity of 99.9% and a water content of 10 ppm.

Next, the third shutter 122 was opened, and a plurality of organic EL multilayer structures D10 and shield members D20, both prepared as in Examples 1 to 3, were carried into the fore-chamber 120. The third shutter was then closed.

After the fore-chamber 120 was filled with argon gas, the organic EL multilayer structures D10 and shield members D20 were carried into the main working chamber 110. An adhesive was applied to joint portions of the substrates of the organic EL multilayer structures and/or the shield members. The adhesive used herein was a UV-curing epoxy resin adhesive of the cationic curing type 30Y184G (Three Bond K.K.). Then the substrates of the organic EL multilayer structures and the shield members were joined at their joint portions to form assemblies.

Thereafter, the second shutter 131 was opened, and the assemblies were carried into the aft-chamber 130 where the curing means 133 was energized to irradiate UV radiation to the adhesive for curing. The UV luminance was 100 mW/cm$^2$ and the irradiating time was 60 seconds. In this way, organic EL display devices of the structure shown in FIG. 1 were completed.

Finally, the fourth shutter 132 was opened, and the completed organic EL display devices were taken out.

According to the present invention, organic EL display devices having a long lifetime can be manufactured through a smaller number of steps in a simple manner.

The invention has been described in detail with particular reference to preferred embodiments thereof, but it will be understood that variations and modifications can be effected within the spirit and scope of the invention.

We claim:

1. An organic electroluminescent display device comprising
    a substrate,
    a shield member defining a gastight space with said substrate, said shield member being a continuous member free of a filling port and being joined to said substrate with a UV-curing epoxy resin adhesive of the cationic curing type, and
    an organic electroluminescent multilayer structure disposed in said space, said organic electroluminescent multilayer structure including organic materials having a glass transition temperature of up to 140° C.,
    said space being filled substantially solely with an inert gas having a water content of up to 100 ppm.

2. An organic electroluminescent display device according to claim 1 wherein said shield member is a plate member and joined to said substrate with a UV-curing epoxy resin adhesive of the cationic curing type having fine particles dispersed therein which also forms a spacer for defining said space with said substrate and said shield member.

3. A method for preparing an organic electroluminescent display device comprising a substrate, a shield member defining a gastight space with said substrate, and an organic electroluminescent multilayer structure disposed in said space, said space being filled substantially solely with an inert gas,
    said method comprising the steps of
        establishing as a working zone an atmosphere of the inert gas to be contained in said space having a water content of up to 100 ppm, and
        joining the shield member to the substrate with an adhesive in the inert gas atmosphere, thereby confining the inert gas within said space defined between said substrate and said shield member, thereby eliminating a need for the shield member to have a filling port for introducing the inert gas.

4. A method for preparing an organic electroluminescent display device according to claim 3 wherein said adhesive is a UV-curing epoxy resin adhesive of the cationic curing type.

5. A method for preparing an organic electroluminescent display device according to claim 3 further comprising the step of curing said adhesive in the inert gas atmosphere until the curing is completed.

6. A method for preparing an organic electroluminescent display device according to claim 3 further comprising the steps of:
    heating the components of the organic electroluminescent display device in vacuum to remove residual water therefrom,
    carrying the components into the inert gas atmosphere while maintaining them dry, and
    leaving the components to stand in the inert gas atmosphere until the residual water contents in the components reach equilibrium with the water content in the inert gas atmosphere, followed by the joining step.

7. A method for preparing an organic electroluminescent display device according to claim 3 further comprising the steps of:
    successively forming layers on the substrate in distinct vacuum chambers by individual film forming processes appropriate for the respective layers while maintaining the vacuum atmosphere, thereby forming the organic electroluminescent multilayer structure,
    carrying the organic electroluminescent multilayer structure to the subsequent step without exposing it to the air, through a vacuum or an atmosphere of the inert gas to be contained in said space having a water content of up to 100 ppm,
    receiving the organic electroluminescent multilayer structure without exposing it to the air and assembling the shield member to the substrate bearing the organic electroluminescent multilayer structure,
    the working zone in which the assembling step is performed is an atmosphere of the inert gas to be contained in said space, whereby the shield member is joined to the substrate with an adhesive in the inert gas atmosphere, thereby confining the inert gas within said space defined between said substrate and said shield member, thereby eliminating a need for the shield member to have a filling port for introducing the inert gas.

8. A method for preparing an organic electroluminescent display device according to claim 7 wherein the carrying step uses a carrier box whose interior is vacuum or filled with the inert gas to be contained in said space and in which the organic electroluminescent multilayer structure is accommodated.

9. A method for preparing an organic electroluminescent display device according to claim 7 wherein the layer forming step, the carrying step, and the assembling step are performed in working chambers which are connected in a gastight manner.

10. A system for preparing an organic electroluminescent display device comprising a substrate, a shield member defining a gastight space with said substrate, and an organic electroluminescent multilayer structure disposed in said space, said space being filled substantially solely with an inert gas, said system comprising a layer forming section in which layers are successively formed on the substrate in distinct vacuum chambers by individual film forming processes appropriate for the respective layers, thereby forming the organic electroluminescent multilayer structure, and an assembling section connected to the layer forming section in a gastight manner in which the shield member is assembled to the substrate bearing the organic electroluminescent multilayer structure, wherein said assembling section includes a fore-chamber connecting said layer forming section to said assembling section in a gastight manner and a main working chamber in which an adhesive is applied to said shield member and/or said substrate bearing the organic electroluminescent multilayer structure, and said shield member and said substrate are joined together, at least said main working chamber is connected to a vacuum means and an inert gas source so as to establish an inert gas atmosphere having a water content of up to 100 ppm in said main working chamber where the joining operation is performed.

11. A system for preparing an organic electroluminescent display device according to claim 10 wherein said assembling section further includes an aft-chamber connected to said main working chamber in a gastight manner in which the adhesive is cured.

12. A system for preparing an organic electroluminescent display device according to claim 10 wherein said layer forming section includes a vacuum vessel and a holding/carrying means disposed in the vacuum vessel, and said distinct vacuum chambers are disposed around the vacuum vessel.

* * * * *